United States Patent
Martin et al.

[11] Patent Number: 6,143,598
[45] Date of Patent: Nov. 7, 2000

[54] METHOD OF FABRICATION OF LOW LEAKAGE CAPACITOR

[75] Inventors: John Elmslie Martin, Singapore, Singapore; Lap Chan, San Francisco, Calif.; John Leonard Sudijono; Ting Cheong Ang, both of Singapore, Singapore

[73] Assignees: Chartered Semiconductor Manufacturing Ltd.; Nanyang Technological University of Singapore, both of Singapore, Singapore

[21] Appl. No.: 09/246,893

[22] Filed: Feb. 8, 1999

[51] Int. Cl.[7] .................................................. H01L 21/8242
[52] U.S. Cl. ............................................. 438/240; 438/253
[58] Field of Search ........................ 438/3, 240, 250–256, 438/390–399

[56] References Cited

U.S. PATENT DOCUMENTS

| | | | |
|---|---|---|---|
| 5,250,456 | 10/1993 | Bryant ......................................... | 437/47 |
| 5,352,623 | 10/1994 | Kamiyama ................................. | 437/52 |
| 5,407,870 | 4/1995 | Okada et al. ............................. | 437/241 |
| 5,438,012 | 8/1995 | Kamiyama ................................. | 437/60 |
| 5,508,221 | 4/1996 | Kamiyama . | |
| 5,583,070 | 12/1996 | Liao et al. ................................. | 437/52 |
| 5,629,221 | 5/1997 | Chao et al. ............................... | 438/591 |
| 5,859,760 | 1/1999 | Park et al. ................................ | 361/313 |
| 5,985,730 | 11/1999 | Lim ........................................... | 438/393 |

*Primary Examiner*—Jey Tsai
*Attorney, Agent, or Firm*—George O. Saile; Rosemary L.S. Pike

[57] ABSTRACT

A capacitor element of a semiconductor device used for high density semiconductor circuits is formed by the steps of forming the bottom plate of the capacitor, submitting the top of the bottom plate to plasma treatment in an oxidizing medium where nitrogen and oxygen are present, depositing a dielectric layer and submitting the top of the dielectric layer to plasma treatment in an oxidizing medium where nitrogen and oxygen are present. Various materials are used for the plasma treatment in an oxidizing medium where nitrogen and oxygen are present. While the present invention uses amorphous silicon as the dielectric material, plasma treatment in an oxidizing medium where nitrogen and oxygen are present can readily applied to a number of other dielectric materials. The objective in constructing capacitors for semiconductor circuits is to reduce the thickness of the dielectric material as much as possible and use a dielectric material for the dielectric which has a high dielectric constant, this increases the value of the capacitor electrical charge which can be carried by the capacitor. The objective of the present invention is to eliminate the leakage current between the plates of a capacitor so that the capacitor can maintain a high voltage between the top and the bottom plate.

16 Claims, 4 Drawing Sheets

| 5V bias 1K array | | No treatment (Control) Leakage current (µA) | O₂ treatment Leakage current (µA) | N₂O plasma treatment Leakage current (µA) |
|---|---|---|---|---|
| | Top Electrode | >20 | >20 | 0.1 |
| | Bottom Electrode | >20 | 6.7 | 0.012 |

Fig. 11

| 5V bias | | No treatment (Control) Leakage current (A) | O₂ treatment Leakage current (A) | N₂O plasma treatment Leakage current (A) |
|---|---|---|---|---|
| | Top Electrode | 5.23 nA | 2.88 nA | 12.5 pA |

Fig. 12

METHOD OF FABRICATION OF LOW LEAKAGE CAPACITOR

BACKGROUND OF THE INVENTION (1) Field of the Invention

The invention relates to the fabrication of integrated circuit devices, and more particularly, to a method of fabricating a low leakage capacitor in an integrated circuit.

(2) Description of Prior Art

A continuing trend in the field of electronic integrated circuits is to increase the density of circuit functions per semiconductor unit of area. This increased density is obtained through reduction of the physical feature size of the elements in the integrated circuits.

For many manufacturers, dynamic random access memories (DRAM's) are the circuits which have the highest density and smallest feature size. However, the capacitance of a DRAM cannot be scaled at the same rate at which other circuit features are scaled back, beyond a certain point. One way therefore to maintain constant capacitance with decreasing feature size is to reduce the thickness of the dielectric material. This reduction brings with it increased susceptibility to higher leakage currents between the plates of the capacitor which in turn leads to a limitation on the voltage which can be applied across the capacitor. Since the charge stored is equal to the voltage across the capacitance times the capacitance, a reduction in the applied voltage requires a further increase in the capacitance in order to store the same charge, further aggravating the problem. The ability to store charge is then a function of either the thickness of the dielectric or the dielectric constant or the resistance to leakage current of the dielectric or the surface area of the capacitance.

Where silicon dioxide is the dielectric material, ultra thin dielectrics are difficult to fabricate as these dielectric films are particularly susceptible to pin holes and other defects. Furthermore, these films are prone to high leakage currents and complete breakdown of the dielectric barrier region if high voltages are placed across the capacitor.

A common technique to increase the dielectric constant of a capacitor is to increase the dielectric constant of the capacitor from that of pure silicon dioxide.

Another technique is to decrease the leakage current between the plates of the capacitor. Different types of dielectric materials ($SiO_2$, $Si_3N_4$, $Ta_2O_5$) sandwiched between the two electrodes of a capacitor can result in the reduction of leakage current between the capacitor plates but this reduction is of limited extent. Additional methods and techniques are therefore needed to further reduce the leakage current.

The increase in surface area of the capacitance plates is in contradiction with the trend of reducing component size and is therefore an approach that is severely limited.

U.S. Pat. No. 5,352,623 (Kamiyama) shows a nitridation (RTN) process (using $NH_3$ of a (forming a very thin SiON or Si-Rich oxide layer) (*) polysilicon electrode before a capacitor dielectric is formed there over. See Col. 4, lines 4–15. However, this generally shows the invention's (*), but differs from the exact process of the invention.

U.S. Pat. No. 5,438,012 (Kamiyama) shows a nitridation (RTN) process (using $NH_3$) of a (*) polysilicon electrode before a capacitor dielectric is formed there over. However, this generally shows the invention's (*), but differs from the exact process of the invention.

U.S. Pat. No. 5,629,221 (Chao et al.). shows a $N_2$ plasma treatment for a polysilicon gate, not capacitor.

U.S. Pat. No. 5,583,070 (Liao et al.) shows a $N_2$ anneal of a polysilicon HSG layer and formation of a SiON/N/SiON capacitor dielectric layer.

U.S. Pat. No. 5,407,870 (Okada et al.) shows a $N_2O$ or $N_2$ plasma treatment to form a Si-Rich SiON layer over a poly electrode. Okada forms a Si-Rich SiON/O/Si-rich SiON capacitor dielectric layer. See cols. 3 and 4. Okada's $N_2$ treatments do not include $SiH_4$ in contrast to the invention's $N_2$ and $SiH_4$ plasma treatment. However, Okada is very close to the invention.

U.S. Pat. No. 5,250,456 (Bryant) shows a oxidation sealing layer over an ONO capacitor dielectric layer to reduce leakage and pinholes. See Col. 7, lines 21 to 34 and Col. 8. However, Bryant does not use the invention's $N_2$ and $SiH_4$.

SUMMARY OF THE INVENTION

In the usual fabrication of the capacitor, a dielectric material is deposited between either 2 metal or polysilicon electrodes. This material forms the interface of the capacitor. However this method results in high leakage current between the plates of the capacitor. In the proposed method, plasma treatments are employed at the interface between the dielectric and the electrode or, when sandwiched dielectric layers are used, between the interfaces of the dielectric layers. These plasma treatments serve to passivate the interface of the capacitor, which leads to lower leakage currents of the capacitor without having any negative effect on the remaining design and performance characteristics of the capacitor.

In our experiments, the capacitive leakage current was evaluated on both a single capacitor and on an array of one thousand capacitors. Capacitor structures without plasma treatments were used as control samples. This allowed for the evaluation of the effectiveness of the plasma treatments in reducing leakage currents and for evaluating the effects that the plasma treatments have on the design and performance characteristics of the capacitors. In our experiments amorphous silicon was used as the dielectric, however other dielectrics are equally suitable for plasma treatment.

FIG. 1 indicates the bottom electrode 10 of a capacitor 18, the top electrode 12 and the dielectric 14 of the capacitor. For this configuration, plasma treatment has been applied at interfaces 16, that is between the top electrode 12 of the capacitor 18 and the dielectric 14 as well as at the interface between the bottom electrode 10 and the dielectric 14.

FIG. 2 shows a sandwiched dielectric interface 14 used for the construction of the capacitor 18, that is the dielectric interface 14 of the capacitor 18 consists of more than one dielectric layer. This construction brings with it that the layers of the dielectric 14 have interfaces, these interfaces between dielectric layers also undergo plasma treatment in addition to the plasma treatment of the interfaces between the dielectric 14 and the capacitor top 12 and bottom plate 10, as indicated with 16 in FIG. 2.

A principle object of the present invention is to provide a method of reducing the leakage current between the plates of capacitors applied within a semiconductor circuit.

Another object of the present invention is to provide a method of applying plasma treatment to the bottom electrode of capacitors within a semiconductor circuits.

Another object of the present invention is to provide a method of applying plasma treatment to the last or top dielectric of capacitors within a semiconductor circuits.

Another object of the present invention is to provide a method of applying plasma treatment between dielectric layers which form the dielectric between the plates of capacitors within a semiconductor circuits.

Another objective is to reduce the leakage current of one or a multiplicity of capacitors within a semiconductor circuit.

The invention may be incorporated into a method for forming an integrated circuit capacitor, such as is used in a dynamic random access memory (DRAM). Plasma treatments are employed to form the dielectric layer and at the electrode interface. These plasma treatments serve to passivate the interface thereby leading to lower leakage currents without having a negative impact on other capacitance characteristics such as electrical storage capacity.

BRIEF DESCRIPTIONS OF THE DRAWINGS

The above and other objects, features and advantages of the present invention will be apparent from the following description of preferred embodiments of the present invention explained with reference to the accompanying drawings, in which:

FIGS. 10–12 shows the formation of the top electrode.

DETAILED DESCRIPTION OF THE PREFERRED EMBODIMENTS

Now, the present invention will be described with reference to the accompanying drawings. It should be noted that, throughout the following explanation, similar reference symbols or numerals refer to the same or similar elements in all the figures or the drawings.

Figure 1:
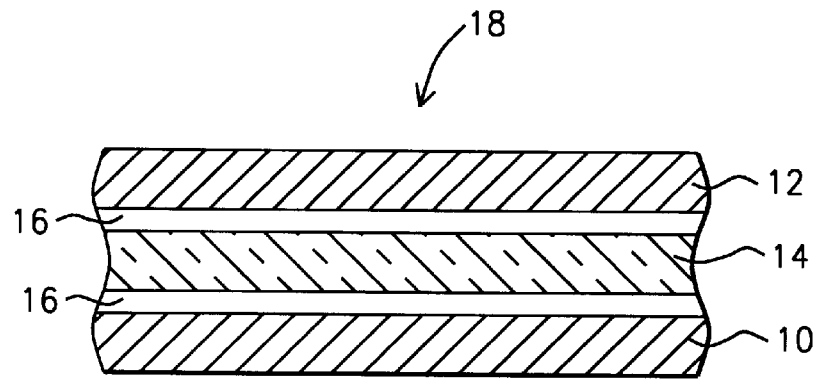
FIG. 1 shows a cross section of a capacitor having one layer of dielectric.
Figure 2:
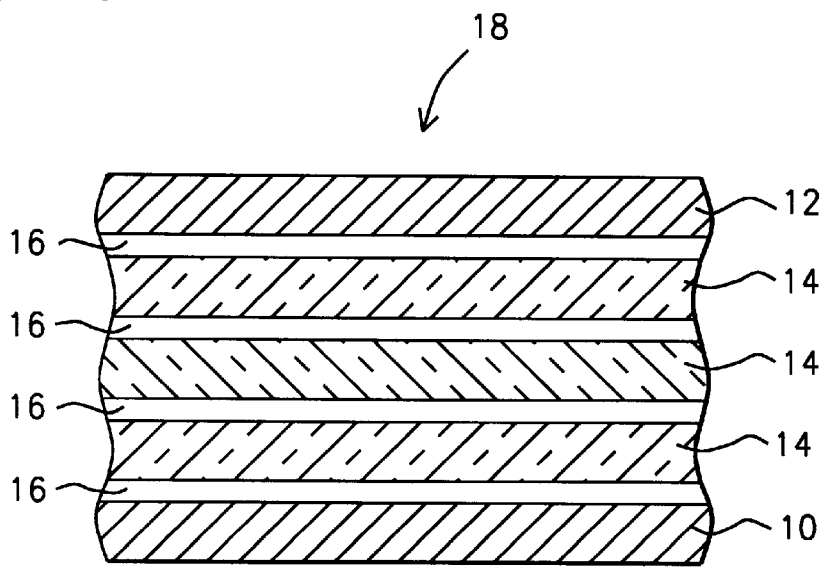
FIG. 2 shows a cross section of a capacitor having multiple sandwiched layers of dielectric.
Figure 3:
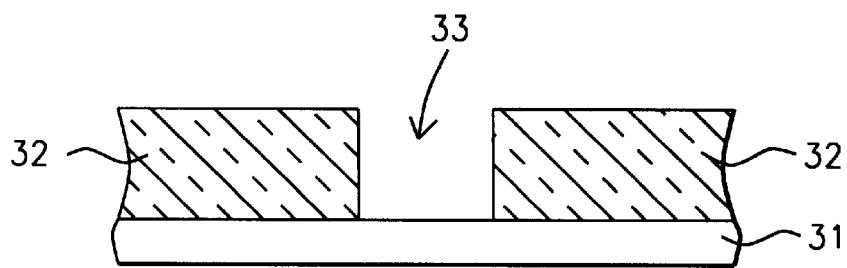
FIG. 3 shows the contact opening for the bottom electrode.

Refer now specifically to FIG. 3. On a base layer 31 an Inter Metal Dielectric (IMD) layer 32 is formed by the CVD process. This IMD is patterned using standard lithography and etching techniques to form the contact opening 33 for the bottom electrode. Through this opening 33 the as yet to be formed bottom plate of the capacitor is connected to other components or elements within the structure of the semiconductor circuit.

Base layer 31 in most instances of capacitor construction is a silicon substrate but the present invention does not limit itself to the use of a silicon substrate for the base layer. Any layer which is adequately isolated from the other components of the semiconductor circuit by any valid semiconductor diffusion, dielectric deposition or any other manner, may be used as the indicated base layer 31. The base layer is also not limited to the construction of one capacitor but can form the base layer for an array of capacitors. Such an array of capacitors is not, within the context of or as a consequence of the present invention, limited to the number or size of capacitors being constructed. Base layer 31 is typically made using Ti/TiN while typical dimensions for opening 33 are a width of 0.4 um and a height of 0.3 um.

Figure 4:
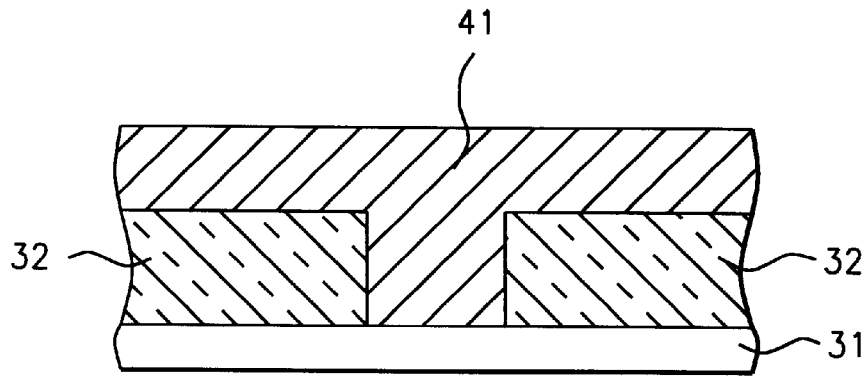
FIG. 4 shows the bottom electrode blanket deposition for the bottom electrode.

The bottom electrode is now deposited, FIG. 4. This deposition fills the contact opening 33 in addition to depositing the layer 41 for the bottom electrode on top of the metal dielectric 32. Standard CVD techniques can be used for this deposition.

Typical embodiments of the present invention use a titanium oxide monolayer for the plates or electrodes of the capacitor. The same effects as described herein for the present invention are obtainable with tungsten or such composite films as titanium oxide/tungsten, titanium nitride/molybdenum, titanium nitride/tungsten silicide.

Standard planarization techniques are used to plane down the layer for the bottom electrode to the top of layer 32, the IMD.

Figure 5:
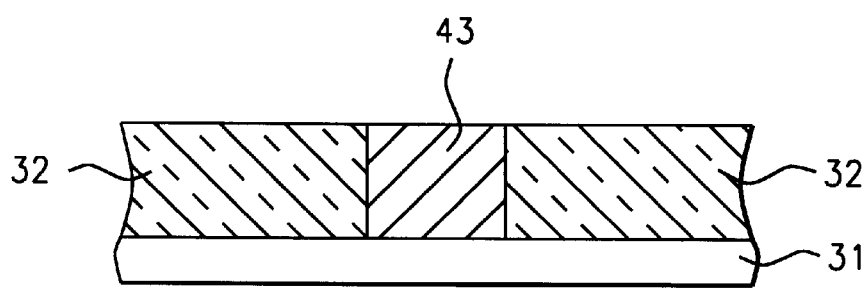
FIG. 5 shows after planarization of the bottom electrode.
Figure 6:
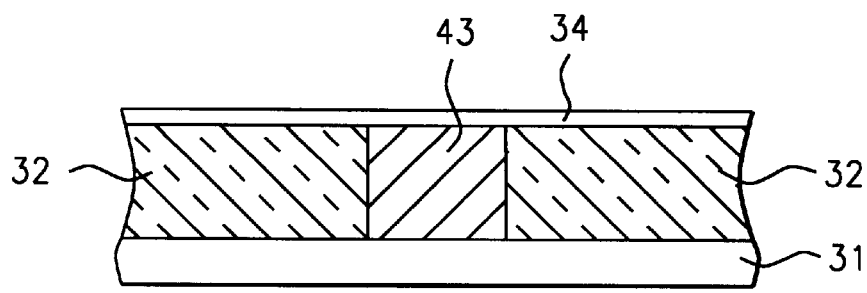
FIG. 6 shows the plasma layer created by plasma treatment.

After the formation of the bottom electrode, FIG. 5, the first plasma treatment takes place, see 34, FIG. 6. The detailed description of the process parameters for the $N_2O$ plasma treatment of the capacitor dielectric is as follows:

| Silicane (low flow): | 10 sccm ± 20% |
| --- | --- |
| $N_2O$: | 1400 sccm ± 20% |
| Ar: | 1000 sccm ± 20% |
| Pressure: | 4.5 torr ± 2 torr |
| Deposition temp.: | 350 degree C. |
| RF power: | 50 W ± 30 W |
| Susceptor spacing: | 550 mils ± 100 mils |

The indicated susceptor spacing is the distance between the wafer surface and the shower head.

In most cases, $N_2O$ plasma or $N_2O$ and $SiH_4$ are used for the plasma treatments. For the present invention, Ar has been used to enhance the deposition rate. The deposited oxide usually exhibits better thickness uniformity with Ar dilution and is more Si-rich than oxides deposited without Ar dilution.

Figure 7:
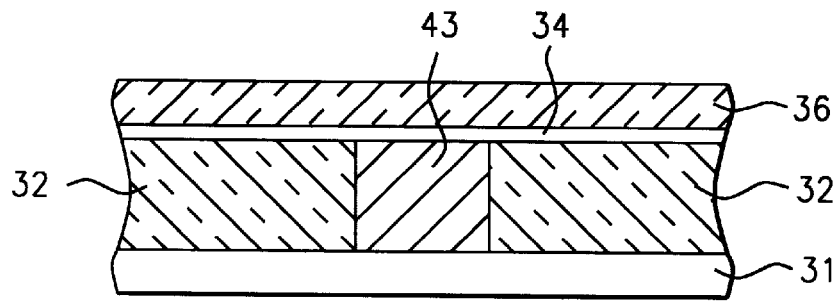
FIG. 7 shows the deposition of a dielectric with a high dielectric constant.

After plasma treatment has been completed, the dielectric layer 36 is deposited, FIG. 7. The material used for the dielectric normally requires a high dielectric constant k, such as ONO, $Ta_2O_5$. Standard semiconductor deposition techniques can be used for this step.

Figure 8:
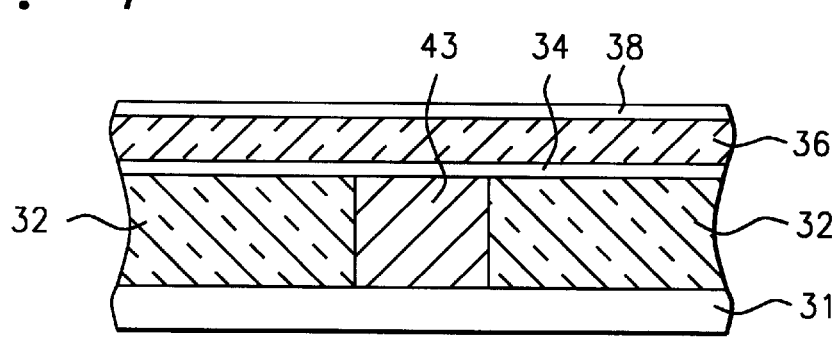
FIG. 8 shows the plasma treatment of the dielectric material.

The top layer 38 of the deposited dielectric material is now plasma treated, FIG. 8. The same plasma treatment as previously detailed for the first plasma treatment can be applied, see details above.

Figure 9:
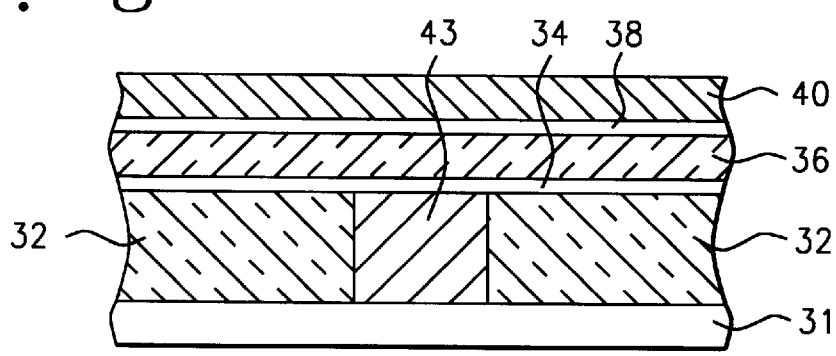
FIG. 9 shows the blanket deposition on top of the previously treated dielectric.

On top of this second plasma layer 38 is deposited the top electrode, see 40, FIG. 9. This deposition uses standard semiconductor Chemical Vapor Deposition techniques. The materials that can be used for the top plate have already been highlighted above, the specifics of temperature, pressure etc. which are to be used for this deposition of the top capacitor plate follow standard, well known semiconductor fabrication practices.

Figure 10:
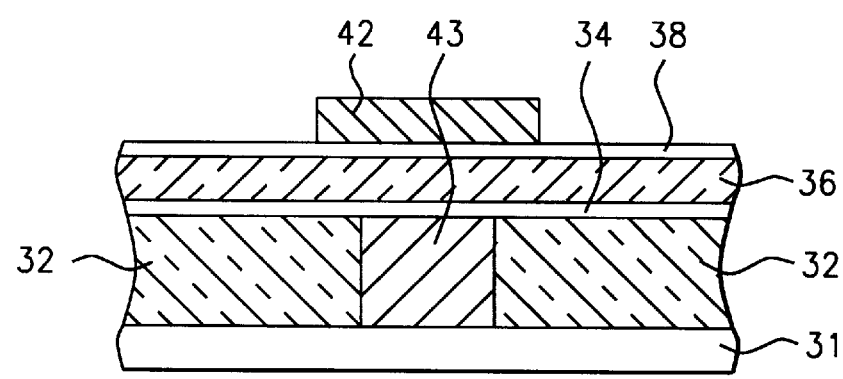

FIG. 10 shows how, by using standard patterning and etching technology, the top electrode 42 for the capacitor has been formed. The dimensions of width and height used for the top plate of the capacitor are not impacted by the subject invention but adhere to standard semiconductor capacitor fabrication standards. The materials used for the top plate have already been indicated, from the selection of materials used for the top plate of the capacitor follow standard semiconductor deposition procedures.

FIG. 11 and FIG. 12 indicate measurements of the leakage current for a 1K capacitor array (FIG. 11) and for a single capacitor (FIG. 12), each under the three following conditions of capacitor construction:
1) no treatment of the deposited layers of the capacitor.
2) $O_2$ treatment where the $O_2$ treatment was applied as described above for the plasma treatment.
3) $N_2O$ plasma treatment, where the plasma treatment was applied as indicated above.

It is clear from FIG. 11 that, for the 1K capacitor array, the top electrode leakage current is not affected by the $O_2$ treatment, the bottom electrode leakage current is reduced by a factor of three. Comparing the leakage current for the same capacitor array after the $N_2O$ plasma treatment, FIG. 11 indicates that the top electrode leakage current is reduced by a very large factor while the bottom electrode leakage current is almost eliminated.

FIG. 12 shows that, for a single capacitor, the $O_2$ treatment has a positive effect on the leakage current, that is this treatment decreases the leakage current. The $N_2O$ plasma treatment further significantly reduces the leakage current for the top electrode.

These test measurement results show that a capacitor structure with an array of 10,000 capacitors meets the requirement that the leakage current is less than 5 microamperes.

Consequently, a higher density capacitor array will be possible thereby allowing the design and manufacture of semiconductor circuits of increased size and increased complexity.

It is clear from the above description, that the construction of the subject capacitor in its simple form contains one dielectric layer where this dielectric layer has been subjected to plasma treatment on both sides of the dielectric, that is just before the dielectric was deposited and just after the dielectric was deposited. Plasma treatment can readily be extended for capacitor constructions, which are of a more complex nature, that is capacitor constructions, which have dielectric depositions of multiple layers. For the construction of such capacitors, the plasma treatment is performed just before and just after the deposition of each dielectric layer.

As has been described in the foregoing, according to the present invention, capacitors used for semiconductor circuits are formed by a process comprising the steps of (1) forming an opening in the inter metal dielectric layer to serve as a contact opening for the bottom electrode through which the bottom electrode can be connected to the semiconductor circuit, (2) forming the bottom electrode, (3) plasma treat the top of the bottom electrode, (4) depositing the dielectric layer, (5) plasma treating the top of the dielectric, 6) depositing and forming the top electrode of the capacitor.

Where multiple layers of dielectric are used for the construction of the capacitor, a plasma treatment is applied before the deposition of each successive dielectric layer and on top of the layer just deposited.

While the present invention has been described in its preferred embodiment, it is understood that the descriptive text are words of description rather than words of limitation and that changes within the scope and meaning of the appended claims may be made without departing from the true scope and spirit of the invention in its broader scope.

What is claimed is:

1. A method of fabricating a semiconductor capacitor comprising the steps of:
   providing a silicon substrate having a surface;
   depositing an inter metal layer on top of said substrate;
   making an opening in the inter metal deposition;
   depositing the first electrode of the capacitor;
   plasma treating in an oxidizing medium where nitrogen and oxygen are present on an exposed top surface of the first electrode;
   depositing the dielectric layer;
   plasma treating in an oxidizing medium where nitrogen and oxygen are present the top of the dielectric layer; and
   depositing and forming the top electrode of the capacitor.

2. The method of fabricating a semiconductor capacitor according to claim 1, wherein said step of plasma treating in an oxidizing medium where nitrogen and oxygen are present the top of the first electrode and/or the top of the dielectric using $N_2O$ for the plasma treatment.

3. The method of fabricating a semiconductor capacitor according to claim 1, wherein said plasma treating in an oxidizing medium where nitrogen and oxygen are present the top of the first electrode and/or the top of the dielectric using $N_2O$ for the plasma treatment while an inert gas such as Ar, He, Ne, Xe is used to enhance the deposition rate.

4. The method of fabricating a semiconductor capacitor according to claim 1, wherein said plasma treating in an oxidizing medium where nitrogen and oxygen are present the top of the first electrode and/or the top of the dielectric using $N_2O$ and $SiH_4$ the plasma treatment.

5. The method of fabricating a semiconductor capacitor according to claim 1, wherein said step of plasma treating in an oxidizing medium where nitrogen and oxygen are present the top of the first electrode and/or the top of the dielectric using $N_2O$ and $SiH_4$ for the plasma treatment while using an inert gas such as Ar, He, Ne or Xe is used to enhance the deposition rate.

6. A method of fabricating a semiconductor capacitor comprising the steps of:
   providing a silicon substrate having a surface;
   depositing an inter metal layer on top of said substrate;
   making an opening in the inter metal deposition;
   depositing the first electrode of the capacitor;
   plasma treating in an oxidizing medium wherein nitrogen and oxygen are present on an exposed top surface of the first electrodes depositing the first dielectric layer;
   plasma treating in an oxidizing medium where nitrogen and oxygen are present the top of the first dielectric layer;
   depositing the second dielectric layer;
   plasma treating in an oxidizing medium where nitrogen and oxygen are present the top of the second dielectric layer; and
   depositing and forming the top electrode of the capacitor.

7. The method of fabricating a semiconductor capacitor according to claim 6, wherein said step of plasma treating in an oxidizing medium where nitrogen and oxygen are present on the top of the first electrode and/or the top of the dielectric using $N_2O$ for the plasma treatment.

8. The method of fabricating a semiconductor capacitor according to claim 6, wherein said step of plasma treating in an oxidizing medium where nitrogen and oxygen are present the top of the first electrode and/or the top of the dielectric using $N_2O$ for the plasma treatment while an inert gas such as Ar, He, Ne or Xe is used to enhance the deposition rate.

9. The method of fabricating a semiconductor capacitor according to claim 6, wherein said step of plasma treating in an oxidizing medium where nitrogen and oxygen are present the top of the first electrode and/or the top of the dielectric using $N_2O$ and $SiH_4$ for the plasma treatment.

10. The method of fabricating a semiconductor capacitor according to claim 6, wherein said step of plasma treating in an oxidizing medium where nitrogen and oxygen are present the top of the first electrode and/or the top of the dielectric using $N_2O$ and $SiH_4$ for the plasma treatment while an inert gas such as Ar, He, Ne or Ke to enhance the deposition rate.

11. A method of fabricating a semiconductor capacitor comprising the steps of:

provided a silicon substrate having a surface;

depositing an inter metal layer on top of said substrate;

making an opening in the inter metal deposition;

depositing a first electrode of said capacitor;

plasma treating in an oxidizing medium wherein nitrogen and oxygen are present on an exposed top surface of said first electron;

depositing the first dielectric layer over said first electrode;

plasma treating in an oxidizing medium where nitrogen and oxygen are present the top of the first dielectric layer;

depositing a second dielectric layer over said plasma treated first dielectric;

plasma treating in an oxidizing medium where nitrogen and oxygen are present the top of the second dielectric;

repeating the preceding two processing step for all other layers of dielectric material that constitute the complete dielectric for the capacitance which is being constructed; and thereover depositing and forming a top electrode of the capacitor and thereby completing said capacitor.

12. The method of fabricating a semiconductor capacitor according to claim 11, wherein said step of plasma treating in an oxidizing medium where nitrogen and oxygen are present the top of the first electrode and/or the top of the dielectric using $N_2O$ for the plasma treatment.

13. The method of fabricating a semiconductor capacitor according to claim 11, wherein said step of plasma treating in an oxidizing medium where nitrogen and oxygen are present the top of the first electrode and/or the top of the dielectric using $N_2O$ for the plasma treatment while Ar is used to enhance the deposition rate.

14. The method of fabricating a semiconductor capacitor according to claim 11, wherein said step of plasma treating in an oxidizing medium where nitrogen and oxygen are present the top of the first electrode and/or the top of the dielectric using $N_2O$ and $SiH_4$ for the plasma treatment.

15. The method of fabricating a semiconductor capacitor according to claim 11, wherein said step of plasma treating in an oxidizing medium where nitrogen and oxygen are present the top of the first electrode and/or the top of the dielectric using $N_2O$ and $SiH_4$ for the plasma treatment while Ar is used to enhance the deposition rate.

16. A method of fabricating a semiconductor capacitor comprising steps of:

providing a silicon substrate having a surface;

depositing an inter metal layer on top of said substrate;

making a contact point for the lower plate of the capacitance under construction providing a point where the capacitance be connected to the electric circuit;

forming the lower plate of the capacitance under construction;

plasma treating in an oxidizing medium wherein nitrogen and oxygen are present on an exposed top surface of said deposited lower plate of the capacitor under construction in order to inhibit the occurrence of leakage currents;

depositing a layer of dielectric material forming the electrical separation between the top plate and the bottom plate of the capacitor;

plasma treating in an oxidizing medium where nitrogen and oxygen are present the top of said deposited layer of dielectric material inhibiting the occurrence of leakage current;

repeating said latter two processing steps for each and every layer of dielectric material which is deposited for the formation of the dielectric interface between said capacitance further inhibiting the capacitance leakage current of the capacitor under construction; and depositing the top plate of the capacitor under construction so as to complete the construction of the capacitor.

* * * * *